(12) United States Patent
Vadhavkar et al.

(10) Patent No.: US 10,748,878 B2
(45) Date of Patent: Aug. 18, 2020

(54) SEMICONDUCTOR DEVICE ASSEMBLY WITH HEAT TRANSFER STRUCTURE FORMED FROM SEMICONDUCTOR MATERIAL

(71) Applicant: Micron Technology, Inc., Boise, ID (US)

(72) Inventors: Sameer S. Vadhavkar, Boise, ID (US); Jaspreet S. Gandhi, Milpitas, CA (US); James M. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/523,804

(22) Filed: Jul. 26, 2019

(65) Prior Publication Data

US 2019/0348401 A1 Nov. 14, 2019

Related U.S. Application Data

(63) Continuation of application No. 16/377,034, filed on Apr. 5, 2019, now Pat. No. 10,559,551, which is a (Continued)

(51) Int. Cl.
*H01L 25/065* (2006.01)
*H01L 25/00* (2006.01)
(Continued)

(52) U.S. Cl.
CPC .......... *H01L 25/0657* (2013.01); *H01L 21/78* (2013.01); *H01L 23/3157* (2013.01); *H01L 23/3178* (2013.01); *H01L 23/3675* (2013.01); *H01L 23/373* (2013.01); *H01L 23/4012* (2013.01); *H01L 24/94* (2013.01); *H01L 24/97* (2013.01); *H01L 25/50* (2013.01); *H01L 23/3738* (2013.01); *H01L 23/5385* (2013.01);
(Continued)

(58) Field of Classification Search
CPC ......... H01L 23/40–4338; H01L 23/367–3738; H01L 2225/06589; H01L 25/0657; H01L 25/50; H01L 23/3157; H01L 23/3178
See application file for complete search history.

(56) References Cited

U.S. PATENT DOCUMENTS

2005/0224968 A1* 10/2005 Ho ...................... H01L 23/5389
257/737
2006/0214277 A1* 9/2006 Saeki .................. H01L 25/0657
257/684

(Continued)

*Primary Examiner* — Zandra V Smith
*Assistant Examiner* — Jeremy J Joy
(74) *Attorney, Agent, or Firm* — Perkins Coie LLP

(57) ABSTRACT

Semiconductor device assemblies with heat transfer structures formed from semiconductor materials are disclosed herein. In one embodiment, a semiconductor device assembly can include a thermal transfer structure formed from a semiconductor substrate. The thermal transfer structure includes an inner region, an outer region projecting from the inner region, and a cavity defined in the outer region by the inner and outer regions. The semiconductor device assembly further includes a stack of first semiconductor dies in the cavity, and a second semiconductor die attached to the outer region of the thermal transfer structure and enclosing the stack of first semiconductor dies within the cavity.

19 Claims, 7 Drawing Sheets

Related U.S. Application Data continuation of application No. 15/693,750, filed on Sep. 1, 2017, now Pat. No. 10,297,577, which is a continuation of application No. 14/716,176, filed on May 19, 2015, now Pat. No. 9,768,149.

(51) Int. Cl.

| | | |
|---|---|---|
| *H01L 23/31* | (2006.01) | |
| *H01L 23/373* | (2006.01) | |
| *H01L 23/40* | (2006.01) | |
| *H01L 23/367* | (2006.01) | |
| *H01L 23/00* | (2006.01) | |
| *H01L 21/78* | (2006.01) | |
| *H01L 25/18* | (2006.01) | |
| *H01L 23/538* | (2006.01) | |

(52) U.S. Cl.
CPC .............. *H01L 24/05* (2013.01); *H01L 24/13* (2013.01); *H01L 24/16* (2013.01); *H01L 24/17* (2013.01); *H01L 24/32* (2013.01); *H01L 24/73* (2013.01); *H01L 24/92* (2013.01); *H01L 25/18* (2013.01); *H01L 2224/0401* (2013.01); *H01L 2224/0557* (2013.01); *H01L 2224/131* (2013.01); *H01L 2224/13025* (2013.01); *H01L 2224/13147* (2013.01); *H01L 2224/16146* (2013.01); *H01L 2224/16227* (2013.01); *H01L 2224/17181* (2013.01); *H01L 2224/32145* (2013.01); *H01L 2224/32225* (2013.01); *H01L 2224/73203* (2013.01); *H01L 2224/73204* (2013.01); *H01L 2224/73253* (2013.01); *H01L 2224/92242* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06555* (2013.01); *H01L 2225/06589* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/167* (2013.01); *H01L 2924/1632* (2013.01); *H01L 2924/16235* (2013.01); *H01L 2924/16251* (2013.01)

(56) References Cited

U.S. PATENT DOCUMENTS

| | | | |
|---|---|---|---|
| 2007/0216001 A1* | 9/2007 | Nakamura | H01L 21/561 257/678 |
| 2010/0044856 A1 | 2/2010 | Sri-Jayantha et al. | |
| 2010/0258931 A1* | 10/2010 | Yoshida | H01L 24/97 257/686 |
| 2010/0261311 A1* | 10/2010 | Tsuji | H01L 21/561 438/109 |
| 2011/0147916 A1* | 6/2011 | Su | H01L 21/54 257/692 |
| 2011/0244628 A1 | 10/2011 | Ode et al. | |
| 2011/0304036 A1* | 12/2011 | Son | H01L 23/3128 257/693 |
| 2013/0099368 A1* | 4/2013 | Han | H01L 23/13 257/692 |
| 2013/0119528 A1* | 5/2013 | Groothuis | H01L 23/36 257/690 |
| 2014/0054772 A1* | 2/2014 | Jeong | H01L 23/5386 257/738 |
| 2014/0210068 A1 | 7/2014 | Bartley et al. | |
| 2015/0035134 A1* | 2/2015 | Hung | H01L 23/3675 257/712 |
| 2015/0108628 A1* | 4/2015 | Yu | H01L 23/42 257/738 |
| 2015/0155218 A1* | 6/2015 | Hung | H01L 23/49827 257/690 |
| 2015/0170991 A1 | 6/2015 | Li et al. | |
| 2015/0262972 A1* | 9/2015 | Katkar | H01L 21/561 257/48 |
| 2015/0279431 A1* | 10/2015 | Li | H01L 25/50 365/51 |
| 2015/0333026 A1 | 11/2015 | Gandhi et al. | |
| 2016/0111406 A1* | 4/2016 | Mak | H01L 25/18 257/773 |
| 2016/0322340 A1* | 11/2016 | Li | H01L 25/18 |

\* cited by examiner

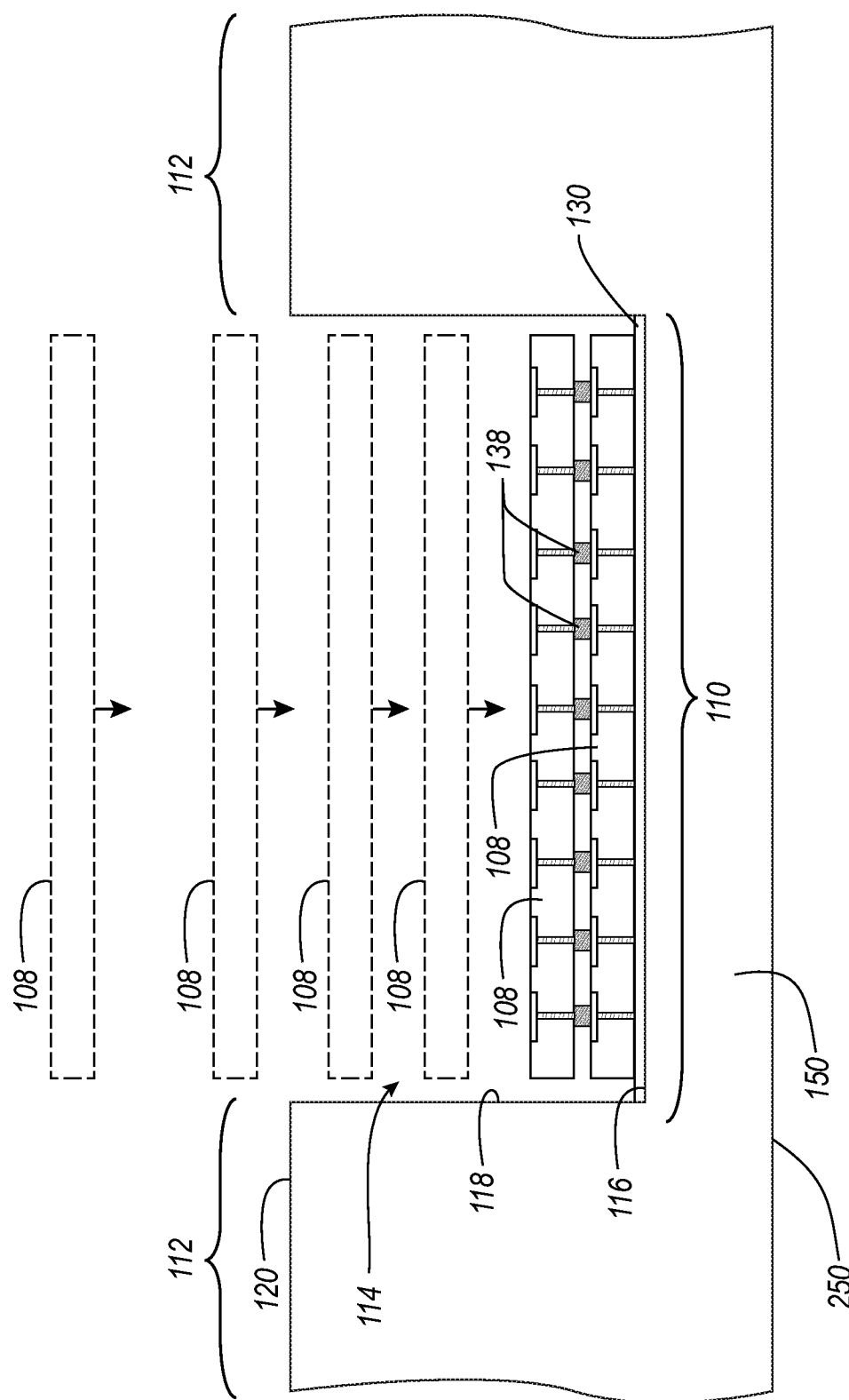

us 10,748,878 B2

SEMICONDUCTOR DEVICE ASSEMBLY WITH HEAT TRANSFER STRUCTURE FORMED FROM SEMICONDUCTOR MATERIAL

CROSS-REFERENCE TO RELATED APPLICATIONS

This application is a continuation of U.S. application Ser. No. 16/377,034, filed on Apr. 5, 2019, now U.S. Pat. No. 10,559,551, which is a continuation of U.S. application Ser. No. 15/693,750, filed on Sep. 1, 2017, now U.S. Pat. No. 10,297,577, which is a continuation of U.S. application Ser. No. 14/716,176, filed on May 19, 2015, now U.S. Pat. No. 9,768,149, the entire disclosure of each which is incorporated herein by reference.

TECHNICAL FIELD

The disclosed embodiments relate to semiconductor device assemblies, and in particular to semiconductor device assemblies with heat transfer structures formed from semiconductor materials.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs). In vertically stacked packages, the heat generated is difficult to dissipate, which increases the operating temperatures of the individual dies, the junctions therebetween, and the package as a whole. This can cause the stacked dies to reach temperatures above their maximum operating temperatures ($T_{max}$) in many types of devices.

BRIEF DESCRIPTION OF THE DRAWINGS

FIGS. 2A-2D are cross-sectional views showing a semiconductor device assembly at various stages of manufacture in accordance with embodiments of the present technology.

DETAILED DESCRIPTION

Specific details of several embodiments of stacked semiconductor die assemblies with a thermal transfer structure formed from a semiconductor material are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates).

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
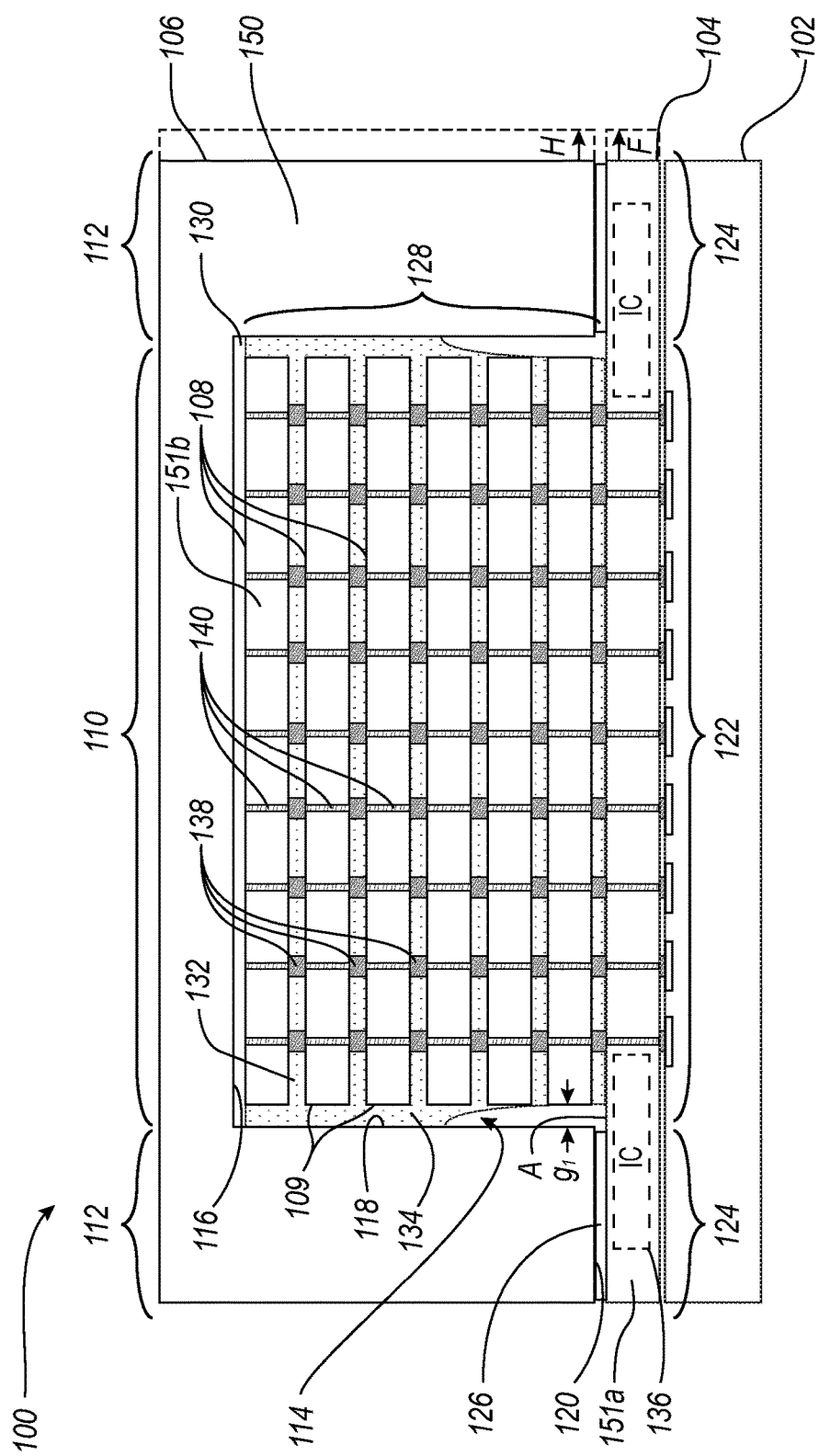
FIG. 1 is a cross-sectional view of a semiconductor device assembly configured in accordance with an embodiment of the present technology.

FIG. 1 is a cross-sectional view of a semiconductor device assembly 100 ("assembly 100") configured in accordance with an embodiment of the present technology. As shown, the assembly 100 includes a package support substrate 102 (e.g., an interposer), a first semiconductor die 104 ("first die 104") on the substrate 102, a plurality of second semiconductor dies 108 ("a plurality of second dies 108") mounted to the first die 104, and a thermal transfer structure (TTS) 106 formed from a semiconductor material 150 over the first and second dies 104 and 108 (e.g., a silicon substrate). The TTS 106 includes an inner region 110, an outer region 112 projecting from the inner region 110, and a cavity 114 defined in the outer region 112 by the inner and outer regions 110 and 112. The TTS 106 further includes a recessed surface 116 along the inner region 110 in the cavity 114, a sidewall surface 118 along the outer region 112 in the cavity 114, and an outer surface 120 along the outer region 112 outside the cavity 114.

The first die 104 includes a base region 122 and a peripheral region 124 (known to those skilled in the art as a "porch" or "shelf") adjacent the base region 122 and attached to the outer surface 120 of the TTS 106 with a first adhesive 126. The second dies 108 are arranged in a stack 128 ("die stack 128") on the base region 122 of the first die 104 and are attached to the recessed surface 116 of the TTS 106 by a second adhesive 130, which can be the same adhesive as the first adhesive 126 or a different adhesive. Suitable adhesives can include, for example, a thermal interface material ("TIM") or other adhesive containing, e.g., silicone-based greases, gels, or adhesives that are doped with conductive materials (e.g., carbon nano-tubes, solder materials, diamond-like carbon (DLC), etc.), as well as phase-change materials. The assembly 100 further includes an underfill material 132 between each of the second dies 108 and between the first die 104 and the bottom second die 108. The underfill material 132 can include an excess portion 134 ("excess underfill material 134") that extends into a gap $g_1$ between the die stack 128 and the sidewall surface 118 of the outer region 112. In some embodiments, the gap $g_1$ can be sized to prevent or inhibit the spread of the excess underfill material 132 onto the outer surface 120 of the outer region 112 during deposition of the underfill material 132.

Each of the first and second dies 104 and 108 can be formed using a semiconductor substrate 151a and 151b, respectively, and can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, the assembly 100 can be configured as a hybrid memory cube (HMC) in which the stacked second dies 108 are DRAM dies or other memory dies that provide data storage and the first die 104 is a high-speed logic die that provides memory control (e.g., DRAM control) within the HMC. In other embodiments, the first and second dies 104 and 108 may include other semiconductor components and/or the semiconductor components of the individual second dies 108 in the die stack 128 may differ. In the embodiment illustrated in FIG. 1, the first die 104 includes an integrated circuit 136 that extends at least partially into the peripheral region 124. In one embodiment, the portion of the integrated circuit 136 that extends into the peripheral region 124 can include one or more circuit components that produce relatively large amounts of heat during operation, such as serial/deserializer (SERDES) circuits. In a related embodiment, circuit components that produce relatively smaller amounts of heat during operation can be located away from the peripheral region and/or directly beneath the die stack.

The die stack 128 can be electrically coupled to the package support substrate 102 and to one another by a plurality of electrically conductive elements 138 (e.g., copper pillars, solder bumps, and/or other conductive features). Each of the first and second dies 104 and 108 can include a plurality of through-silicon vias (TSVs) 140 that are coupled on opposite sides to the conductive elements 138. In addition to electrical communication, the conductive elements 138 and the TSVs 140 transfer heat away from the die stack 128 and toward the semiconductor material 150 of the TTS 106. In some embodiments, the assembly 100 can also include a plurality of thermally conductive elements or "dummy elements" (not shown) positioned interstitially between the first and second dies 104 and 108 to further facilitate heat transfer through the die stack 128. Such dummy elements can be at least generally similar in structure and composition to the conductive elements 138 and/or the TSVs 140 except that they are not electrically coupled to the other circuitry of the first and second dies 104 and 108.

During operation of the assembly 100, the semiconductor material 150 of the TTS 106 absorbs and dissipates the thermal energy produced by the first and second dies 104 and 108. In the embodiment illustrated in FIG. 1, for example, the outer region 112 of the TTS 106 absorbs and dissipates heat from the peripheral region 124 of the first die 104, and the inner region 110 of the TTS 106 absorbs and dissipates heat from the die stack 128. Accordingly, several embodiments of the assembly 100 shown in FIG. 1 can provide enhanced thermal properties that lower the operating temperatures of the first and second dies 104 and 108 in the assembly 100 such that they stay below their designated maximum temperatures ($T_{max}$). This can be very useful when the assembly 100 is arranged as HMC because the first die 104 is usually a logic die and the second dies 108 are generally memory dies, and logic dies typically operate at a much higher power level than memory dies. Additionally, the integrated circuit components (e.g., SERDES components) in the peripheral region 124 generally have a higher power density than the integrated circuit components in the base region 122 beneath the memory dies, which results in higher temperatures at the peripheral region 124.

In some embodiments described in greater detail below, the features of the TTS 106 are formed using semiconductor fabrication techniques. For example, in one embodiment, the cavity 114 can be formed in a semiconductor wafer using etching techniques having relatively tight dimensional tolerances to increase the planarity of the sidewall surface 118 and to precisely control the size of the gap $g_1$ between the sidewall surface 118 and the die stack 128. For example, in some embodiments, the gap $g_1$ can have a thickness that is less than or equal to 500 µm, such as less than or equal to 200 µm (e.g., 100 µm or 50 µm or less). In another embodiment, the gap $g_1$ can be eliminated or nearly eliminated, and the sidewall surface 118 can directly contact one or more of the second dies 108 along corresponding edges 109 of the second dies 108. Such precise control of the size of the gap $g_1$ can decrease or eliminate the gap compared to other processing techniques. Decreasing the gap $g_1$ allows the outer region 112 of the TTS 106 to be located closer to the die stack 128 and can increase the footprint of the outer region over a coverage area (A) of the peripheral region 124 of the first die 104 adjacent the stack 128, thereby increasing heat transfer efficiency between the outer and peripheral regions 112 and 124. Decreasing the gap $g_1$ also reduces the amount of underfill material 132 needed to fill the cavity 114. By contrast, other devices that employ a thermally conductive structure typically include a metal lid formed from a malleable metal (e.g., aluminum) that is mechanically bent or folded into a lid to cover the die stack. Because such lids are shaped by bending the metal lid material, these devices typically have relatively larger dimensional tolerances for the gap between the interior side of the lid and the die stack. These devices can also require a relatively larger amount of underfill material due to the larger gap.

In certain embodiments, the semiconductor material 150 of the TTS 106 is the same material as the substrate 151a of the first die 104 and/or the substrate 151b of one or more of the second dies 108. Therefore, the semiconductor material 150 can have a coefficient of thermal expansion (CTE) that is substantially similar to the CTE of the substrates of the first die 104 and/or the second dies 108. As a result, the TTS 106 can have generally the same amount of volumetric thermal expansion as the first die 104 and/or the second dies 108 at elevated operating temperatures. For example, when the outer region 112 of the TTS 106 and the peripheral region 124 of the first die 104 expand due to an increase in temperature, as shown in FIG. 1 by arrows F and H, respectively, the lateral expansion in these regions (shown in phantom lines) is generally the same or at least substantially the same (i.e., within acceptable tolerances). In some embodiments, such similar expansion enables the TTS 106 and the underlying first die 104 to expand together such that the adhesive 126 is not substantially stretched (i.e., the adhesive maintains good adhesion) during high temperature operation. As a result, the adhesive 126 is less prone to detach or delaminate at elevated temperatures.

Figure 2A:
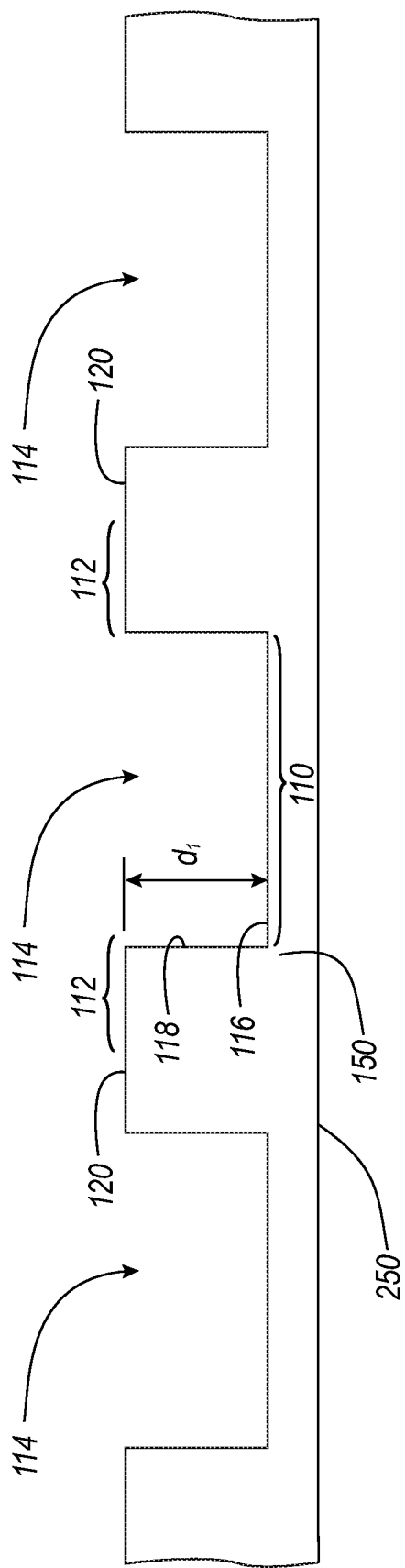

FIGS. 2A-2D are cross-sectional views showing aspects of a method of manufacturing the assembly 100 in accordance with embodiments of the present technology. Like reference numbers refer to like components in FIGS. 1-2D. FIG. 2A is a cross-sectional view of a stage of manufacturing the assembly 100. In the embodiment illustrated in FIG. 2A, the TTS 106 (FIG. 1) is formed from a wafer 250 or other type of substrate comprising the semiconductor material 150, such as silicon (e.g., crystalline silicon). In other embodiments, the semiconductor material 150 can be composed of other materials in addition to or in lieu of silicon, such as polysilicon, aluminum oxide ($Al_2O_3$), sapphire, and/or other suitable semiconductor materials having high thermal conductivities. As discussed above, the semiconductor material 150 can be the same as or similar to the substrate material of the first die 104 and/or the second dies 108 (FIG. 1).

As further shown in FIG. 2A, a hole or depression is etched or otherwise formed in the outer surface 120 to form the sidewall surfaces 118 and the recessed surface 116, which together define the cavity 114 within the outer region 112 and over the inner region 110. In some embodiments, the depression can be formed by patterning a layer of resist material (not shown) and using a wet or dry etching process (e.g., a reactive ion etch). The inner and outer regions 110 and 112 are accordingly integral regions of the same semiconductor material 150. The cavity 114 has a depth $d_1$ such that each of the second semiconductor dies 108 is contained within the cavity 114 when mounted to the recessed surface 116. In at least some embodiments, the cavity depth $d_1$ can be selected based on the number of second dies 108 (e.g., a stack of three, four, six, eight, twelve, twenty or more dies) that are to be positioned with the cavity 114 and/or the thickness of the second dies 108. Further, the width, length, and/or shape of the cavity 114 is based on the shape of the die stack 128 (FIG. 1) and/or its size (e.g., the footprint). In one embodiment, the cavity 114 and the die stack 128 have similar planform shapes (e.g., square or rectangular shapes).

The wafer 250 can be used to form several TTSs 106, and as such several cavities 114 can be formed such that each cavity 114 is associated with an individual TTS 106. In some embodiments, all of the cavities 114 can be configured the same, but in other embodiments one or more of the cavities 114 can have different configurations than the others to accommodate differently sized die stacks. In such cases, some cavities 114 can contain a different number and/or sizes of semiconductor dies than other cavities 114.

FIG. 2B is an enlarged cross-sectional view illustrating stacking of the second dies 108 in the cavity 114 to form the die stack 128 (FIG. 1). The initial second die 108 placed in the cavity 114 is attached to the recessed surface 116 by the adhesive 130. In one embodiment, the adhesive 130 electrically isolates the die stack 128 from the semiconductor material 150. In these and other embodiments, the semiconductor material 150 and/or the initial second die 108 of the die stack 128 can include an insulator material (not shown), such as a thin silicon oxide ($SiO_2$) passivation film, for electrical isolation. In the illustrated embodiment, the second dies 108 are subsequently stacked upon the initial die of the die stack 128, and electrically and mechanically connected via the conductive elements 138. In other embodiments, the die stack 128 can be pre-assembled such that the second semiconductor dies 108 are collectively mounted as a single unit in the cavity 114. In several embodiments the second dies 108 have a thickness in a range of about 50 to about 200 μm (e.g., 60 μm).

Figure 2C:
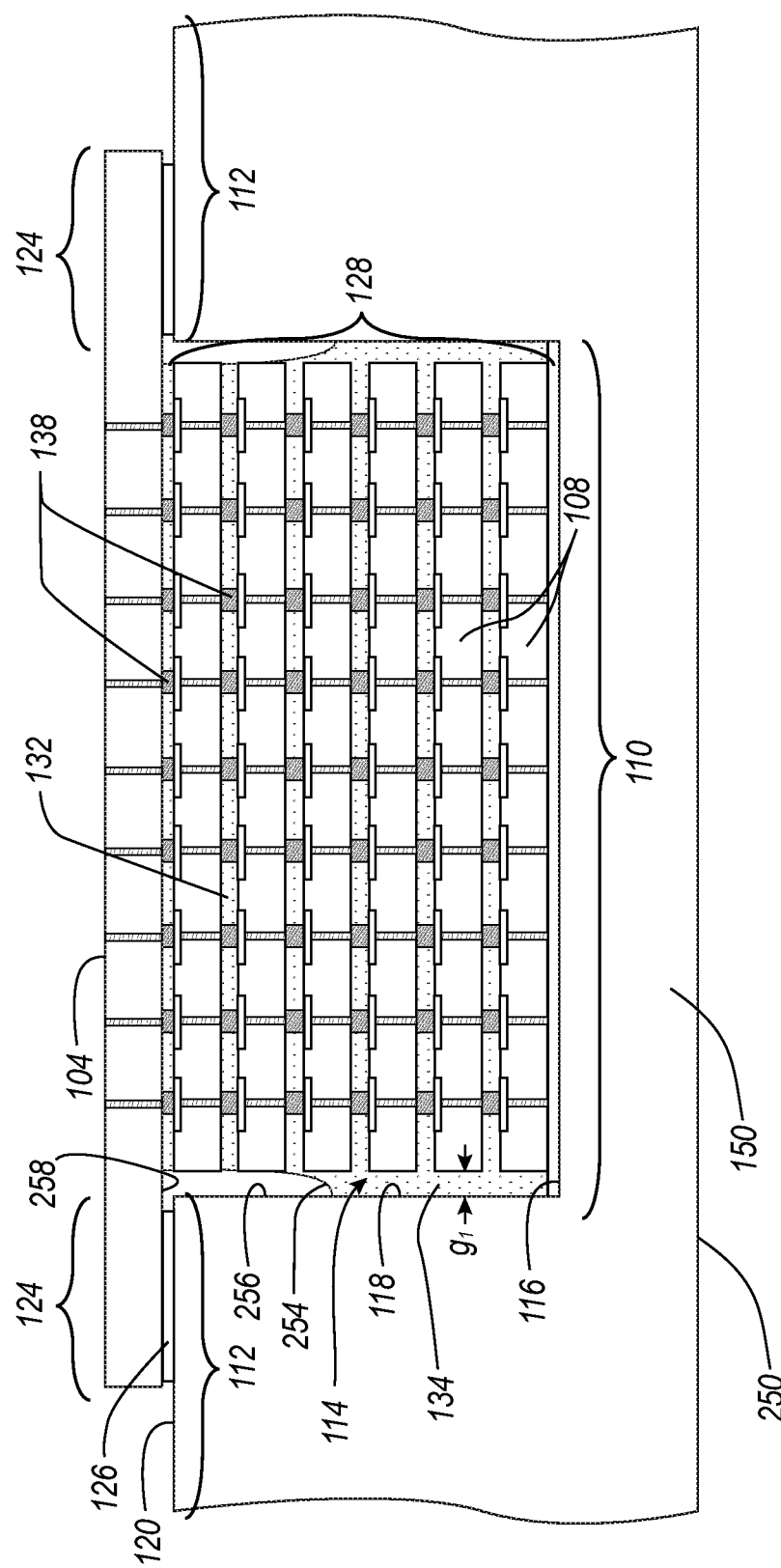

FIG. 2C is an enlarged cross-sectional view illustrating the assembly 100 after the first die 104 has been attached to the outer region 112 of the TTS 106, and the underfill material 132 has been deposited in the cavity 114. As shown, the peripheral region 124 of the first die 104 is attached to the outer region 112 with the adhesive 126 and such that the first die 104 covers the opening of the cavity 114 above the die stack 128. The underfill material 132 fills the regions between the second dies 108 and between the first die 104 and the second die 108 adjacent the first die 104. The underfill material 132 is typically a flowable material that fills the interstitial spaces between the second dies 108 and the conductive elements 138. In one embodiment, the underfill material 132 can be injected into the interstitial spaces by micro-jetting the underfill material between the individual second dies 108. The volume of underfill material 132 is selected to adequately fill the interstitial spaces such that excess underfill material 132 goes into the gap $g_1$ between the sidewall surface 118 and the die stack 128 and forms a fillet 254. The size of the gap $g_1$ and/or the cavity depth $d_1$ (FIG. 2A) can be selected to prevent or inhibit the excess underfill material 134 from flowing onto the outer surface 120 of the outer region 112 and to accommodate the fillet 254 of the underfill material 132. In certain embodiments, a portion 256 of the sidewall surface 118 may be exposed in cases where the underfill material 132 does not completely fill the gap $g_1$. Additionally, in such cases a portion of an outer surface 258 of the first die 104 can also be exposed in the gap $g_1$. In at least some embodiments, the underfill material 132 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. The underfill material 132 can alternatively be a dielectric underfill, such as FP4585 manufactured by Henkel of Dusseldorf, Germany. In some embodiments, the underfill material 132 can be selected based on its thermal conductivity to enhance heat dissipation through the die stack 128.

Figure 2D:
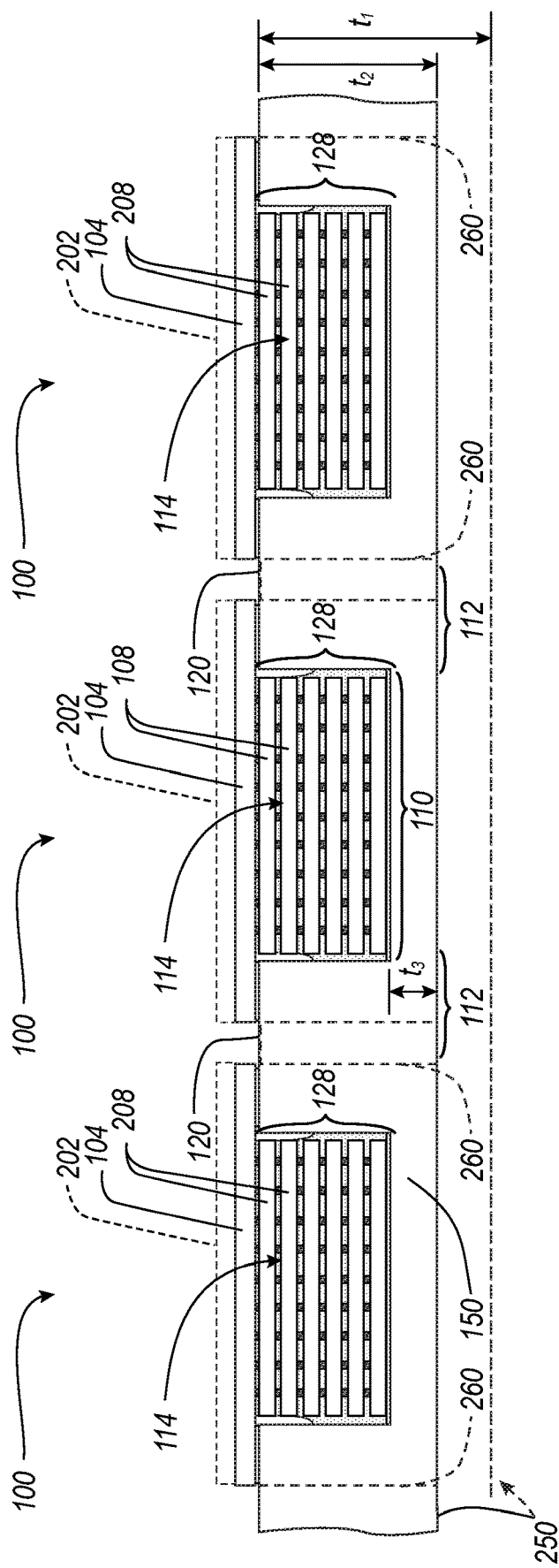

FIG. 2D is a cross-sectional view illustrating a plurality of the assemblies 100 after the wafer 250 has been thinned via, e.g., backgrinding, from a first thickness $t_1$ to a second thickness $t_2$. The second thickness $t_2$ generally defines the thickness of the outer regions 112, as well as a third thickness $t_3$ of the inner region 110 beneath the cavity 114. In one embodiment, the thickness $t_3$ of the inner region 110 can have a thickness in a range of about 50 to about 200 μm (e.g., 60 μm). In some embodiments, the third thickness $t_3$ can be similar to the thickness of the individual second dies 108. In such embodiments, the relatively thin inner region 110 can reduce thermal resistance between the die stack 128 and the external environment compared to devices formed with thicker thermally conductive members. In other embodiments, the wafer 250 can be thinned such that the inner region 110 has a thickness $t_3$ that is greater than 200 μm (e.g., 500 μm). Alternately, in some embodiments, the wafer 250 is not thinned.

As further shown in FIG. 2D, each assembly 100 includes a first semiconductor die 104 (e.g., a logic die) and a plurality of second semiconductor dies 108 or 208 (e.g., memory dies) that have been arranged in die stacks 128 in the cavities 114. The individual first semiconductor dies 104 have been attached to the outer surface 120 of the wafer 250 to cover the corresponding cavities 114. In the embodiment illustrated in FIG. 2D, the cavities 114 are separated from one another by dicing lanes 260 in the semiconductor material 150 through which the wafer 250 can be singulated to define the TTS 106 (FIG. 1) and the individual assemblies 100. As shown, the wafer 250 is singulated after the first dies 104 have been attached to the outer surface 120 of the wafer 250 between the dicing lines 260. In an alternate embodiment, the wafer 250 is singulated before the first dies 104 are attached. In another embodiment, the wafer 250 can be singulated after attaching package support substrates 202 (shown in phantom lines) to the corresponding first dies.

In alternate embodiments, the second dies 108 or 208 are mounted in the cavity 114 of the TTS 106 (e.g., individually or collectively as a single unit) after it has been singulated from the wafer 250 (e.g., rather than mounting the second dies 108 at the stage shown in FIG. 2B). For example, the second dies 108 or 208 can be first mounted to the first die 104 and the TTS 106 can be placed over the second dies 108 or 208 as a lid. Further, in these and other embodiments, the individual first die 104 and the corresponding second dies 108 or 208 can be pre-assembled as a single unit, and this single unit can be inserted in the cavity 114 either before or after singulation from the wafer 250.

Figure 3:
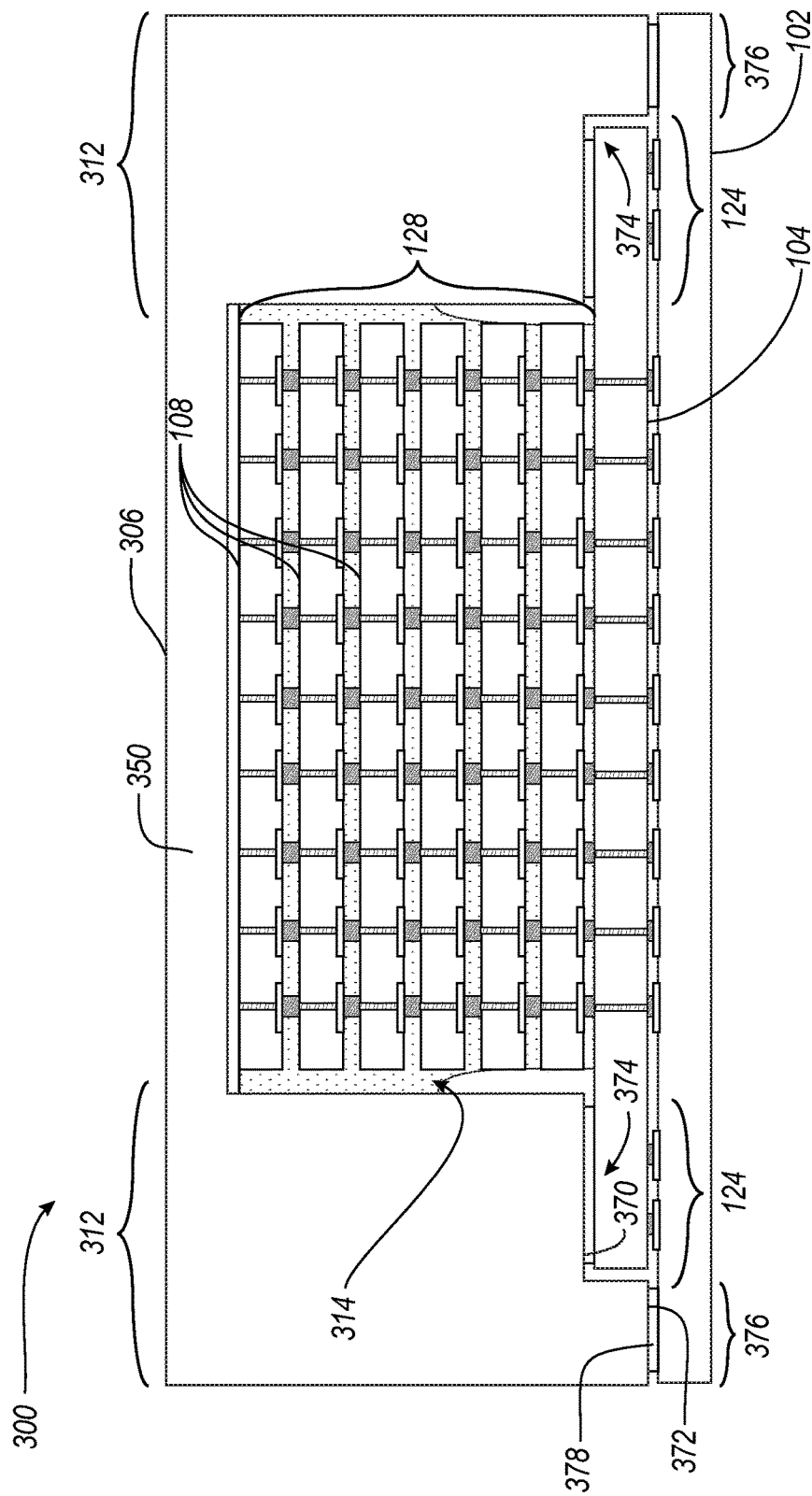
FIG. 3 is a cross-sectional view of a semiconductor device assembly configured in accordance with another embodiment of the present technology.

FIG. 3 is a cross-sectional view of a semiconductor device assembly 300 ("assembly 300") configured in accordance with another embodiment of the present technology. Several features of the assembly 300 are similar to those described above with respect to the assembly 100. For example, the assembly 300 can include the die stack 128 of second semiconductor dies 108 positioned in a cavity 314 of a TTS 306 formed from a semiconductor material 350 (e.g., a silicon substrate). In the embodiment illustrated in FIG. 3, however, the TTS 306 includes an outer region 312 having a recessed portion 370 and a raised portion 372 peripheral to the recessed portion 370, and a support feature or ridge 374 formed with the raised portion 372. In this embodiment, the peripheral region 124 of the first die 104 is attached to the recessed portion 370, and a peripheral portion 376 of the package support substrate 102 is attached to the raised portion 372 via an adhesive 378, such as a TIM. In one aspect of the embodiment illustrated in FIG. 3, the ridge 374 of the TTS 306 can provide additional heat transfer between the package support substrate 102 and the semiconductor material 350 of the TTS 306 through the raised portion 372. In another aspect of this embodiment, the ridge 374 can further secure the first die 104 between the package support substrate 102 and the semiconductor material 350 of the TTS 306.

Figure 4:
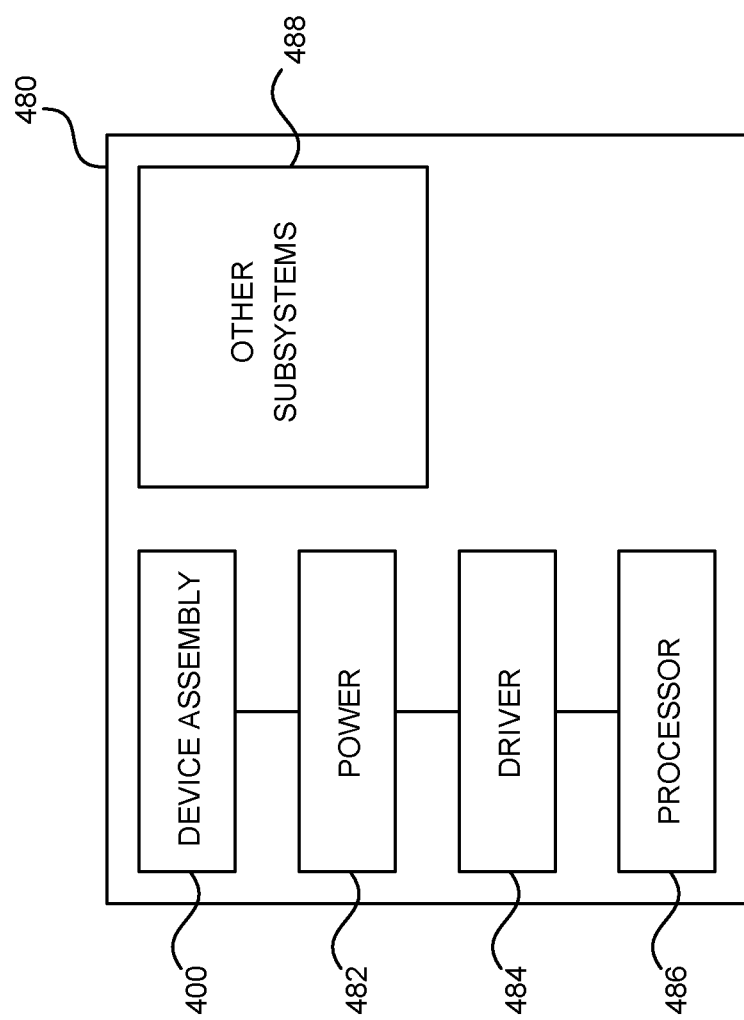
FIG. 4 is a schematic view of a system that includes a semiconductor device in accordance with embodiments of the present technology.

Any one of the stacked semiconductor device assemblies described above with reference to FIGS. 1-3 can be incorporated into any of a myriad of larger and/or more complex systems, a representative example of which is system 480 shown schematically in FIG. 4. The system 480 can include a semiconductor device assembly 400, a power source 482, a driver 484, a processor 486, and/or other subsystems or components 488. The semiconductor device assembly 400 can include features generally similar to those of the semiconductor device assemblies described above with reference to FIGS. 1-3, and can therefore include various features that enhance heat dissipation. The resulting system 480 can perform any of a wide variety of functions, such as memory storage, data processing, and/or other suitable functions. Accordingly, representative systems 480 can include, without limitation, hand-held devices (e.g., mobile phones, tablets, digital readers, and digital audio players), computers, vehicles, appliances and other products. Components of the system 480 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. For example, in one embodiment, the cavity 114 can be positioned off center, and the outer region 112 on one side of the cavity may be larger than the outer region on the other. Further, although many of the embodiments of the semiconductor dies assemblies are described with respect to HMCs, in other embodiments the semiconductor die assemblies can be configured as other memory devices or other types of stacked die assemblies. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of forming a semiconductor device assembly, comprising:
   forming a cavity in a substrate;
   attaching a first semiconductor die to a recessed surface of the cavity;
   stacking a second semiconductor die above the first semiconductor die, wherein the second semiconductor die is coupled with the first semiconductor die via a plurality of conductive elements;
   disposing an underfill material in the cavity, wherein a portion of a sidewall of the cavity is exposed exclusive of the underfill material; and
   attaching a third semiconductor die over the cavity.

2. The method of claim 1, wherein disposing the underfill material in the cavity includes:
   instilling the underfill material in interstitial space between the first semiconductor die and the second semiconductor die; and
   accumulating an excess portion of the underfill material in a gap between the sidewall of the cavity and the stack of the first and second semiconductor dies.

3. The method of claim 1, wherein the second semiconductor die includes a plurality of through-silicon vias (TSVs) configured to couple bond pads of the first semiconductor die with bond pads of the third semiconductor die via the plurality of conductive elements.

4. The method of claim 1, wherein the third semiconductor die includes a base region and a peripheral region adjacent to the base region, and wherein attaching the third semiconductor die over the cavity comprises attaching the base region to the second semiconductor die and the peripheral region to two or more outer regions of the substrate that surround the cavity.

5. The method of claim 4, wherein the two or more outer regions each comprise a recessed portion and a raised portion peripheral to the recessed portion, and wherein attaching the third semiconductor die over the cavity comprises attaching a peripheral region of the third semiconductor die to the recessed portions of the two or more outer regions.

6. The method of claim 5, further comprising:
attaching a support substrate to the raised portions of the two or more outer regions, wherein the support substrate is electrically coupled to the first, second, third semiconductor dies, or a combination thereof.

7. The method of claim 6, wherein the raised portion forms a ridge with respect to the recessed portion to secure the third semiconductor die between the support substrate and the substrate.

8. The method of claim 1, wherein the third semiconductor die comprises a portion over the cavity that is exposed exclusive of the underfill material.

9. A method of forming a semiconductor device assembly, comprising:
forming a structure from a semiconductor substrate, the structure including an inner region, an outer region surrounding and projecting from the inner region, and a cavity defined by the inner region and the outer region;
selectively recessing a first portion of the outer region adjacent to a second portion of the outer region, wherein the first portion is immediately next to the cavity;
attaching a stack of first semiconductor dies to a recessed surface of the cavity;
disposing an underfill material in the cavity after attaching the stack of first semiconductor dies, wherein an excess portion of the underfill material forms a fillet in a gap between a sidewall of the cavity and the stack of first semiconductor dies;
attaching a second semiconductor die to the recessed first portion of the outer region, the second semiconductor enclosing the stack of first semiconductor dies within the cavity; and
attaching a support substrate to the second portion of the outer region.

10. The method of claim 9, wherein a sidewall of the cavity is in contact with an edge of the first semiconductor dies of the stack.

11. The method of claim 9, wherein attaching the second semiconductor die to the recessed first portion of the outer region comprises:
attaching a base region of the second semiconductor die to the stack of first semiconductor dies; and
attaching a peripheral region of the second semiconductor die adjacent to the base region to the recessed first portion of the outer region.

12. The method of claim 9, wherein a peripheral region of the second semiconductor die includes a first circuit component having a greater power density than a second circuit component included in a base region of the second semiconductor die adjacent to the peripheral region.

13. The method of claim 9, wherein attaching the support substrate to the second portion of the outer region comprises:
attaching the support substrate to the second semiconductor die such that the support substrate is electrically coupled to the stack of first semiconductor dies, the second semiconductor die, or both.

14. The method of claim 9, wherein the recessed first portion and the second portion of the outer region collectively form a support feature that secures the second semiconductor die between the support substrate and the structure.

15. The method of claim 9, wherein the second portion attached to the support substrate transfers heat between the support substrate and the outer region of the structure.

16. The method of claim 9, wherein:
the second semiconductor die is attached to the recessed first portion of the outer region via a first adhesive material; and
the support substrate is attached to the second portion of the outer region via a second adhesive material.

17. A method of forming a semiconductor device assembly, comprising:
forming a plurality of cavities in a semiconductor wafer, each cavity of the plurality including a recessed surface of the semiconductor wafer and a sidewall surface of the semiconductor wafer surrounding and extending from the recessed surface;
attaching a stack of first semiconductor dies to the recessed surface of each cavity, wherein the stack of first semiconductor dies is spaced apart from the sidewall surface by a gap;
disposing an underfill material in each cavity including the stack of first semiconductor dies, wherein an excess portion of the underfill material forms a fillet in the gap;
covering an opening of each cavity with a second semiconductor die that includes a base region and a peripheral region adjacent to the base region, wherein the peripheral region overlaps the opening by a first distance; and
singulating the semiconductor wafer using a plurality of dicing lanes, wherein each dicing lane of the plurality is spaced away from the opening of an adjacent cavity by a second distance that is greater than the first distance.

18. The method of claim 17, further comprising:
attaching a support substrate to the second semiconductor die, wherein the support substrate is electrically coupled to the stack of first semiconductor dies, the second semiconductor die, or both.

19. The method of claim 17, wherein a distance between openings of the cavities is equal to or greater than a sum of a width of the dicing lane and twice of the first distance.

* * * * *